United States Patent
Vali et al.

(10) Patent No.: US 6,671,206 B2
(45) Date of Patent: Dec. 30, 2003

(54) HIGH VOLTAGE LOW POWER SENSING DEVICE FOR FLASH MEMORY

(75) Inventors: Tommaso Vali, Sezze (IT); Luca De Santis, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/229,399

(22) Filed: Aug. 27, 2002

(65) Prior Publication Data

US 2003/0058723 A1 Mar. 27, 2003

(51) Int. Cl.[7] .............................................. G11C 16/26
(52) U.S. Cl. ........................ 365/185.21; 365/185.2; 365/185.25; 365/185.33
(58) Field of Search .................... 365/185.02, 185.21, 365/185.25, 185.2, 185.33

(56) References Cited

U.S. PATENT DOCUMENTS

| 3,931,538 | A | * | 1/1976 | Itoh et al. ...................... 327/57 |
| 4,727,519 | A |   | 2/1988 | Morton et al. ......... 365/185.21 |
| 4,763,026 | A |   | 8/1988 | Tsen et al. ..................... 327/56 |
| 5,007,024 | A | * | 4/1991 | Tanaka et al. ............... 365/207 |
| 5,446,685 | A | * | 8/1995 | Holst ............................ 365/49 |
| 5,574,687 | A | * | 11/1996 | Nakase ................... 365/189.06 |
| 5,625,588 | A |   | 4/1997 | Seyyedy et al. ............. 365/149 |
| 5,949,728 | A |   | 9/1999 | Liu et al. ..................... 365/206 |
| 5,999,439 | A |   | 12/1999 | Seyyedy ...................... 365/145 |
| 6,128,226 | A |   | 10/2000 | Eitan et al. ............. 365/185.21 |
| 6,301,175 | B1 |   | 10/2001 | Seyyedy et al. ............. 365/203 |
| 6,331,959 | B1 | * | 12/2001 | Hirota ......................... 365/207 |
| 6,411,550 | B1 |   | 6/2002 | Nasu ...................... 365/185.21 |
| 6,438,038 | B2 | * | 8/2002 | Ikehashi et al. ........ 365/185.24 |
| 2002/0008549 | A1 |   | 1/2002 | Forbes ......................... 327/57 |

* cited by examiner

*Primary Examiner*—Andrew Q. Tran
(74) *Attorney, Agent, or Firm*—Leffert Jay & Polglaze, P.A.

(57) ABSTRACT

Sensing devices for sensing a programmed state of a floating-gate memory cell are adapted for use in low-power memory devices using supply potentials that can be significantly higher than the maximum potential to be achieved on a local bit line during a sensing operation. Such sensing devices include an input node selectively coupled to a floating-gate memory cell and an output node for providing an output signal indicative of the programmed state of the floating-gate memory cell. Such sensing devices further include a feedback loop coupled between a precharge path and the input node of the sensing device. The feedback loop limits the potential level achieved at the input node of the sensing device, thus limiting the potential level achieved by the bit lines during sensing.

46 Claims, 6 Drawing Sheets

HIGH VOLTAGE LOW POWER SENSING DEVICE FOR FLASH MEMORY

RELATED APPLICATIONS

This application claims priority to Italian Patent Application Serial No. RM2001A000531, filed Aug. 29, 2001, entitled "High Voltage Low Power Sensing Device For Flash Memory."

This application is related to U.S. patent application Ser. No. 10/036,751, filed Dec. 21, 2001, entitled "Sensing Scheme for Low-Voltage Flash Memory" and commonly assigned.

TECHNICAL FIELD OF THE INVENTION

The present invention relates generally to semiconductor memory devices, and in particular, the present invention relates to sensing schemes in semiconductor flash memory devices.

BACKGROUND OF THE INVENTION

Semiconductor memory devices are rapidly-accessible memory devices. In a semiconductor memory device, the time required for storing and retrieving information generally is independent of the physical location of the information within the memory device. Semiconductor memory devices typically store information in a large array of cells. A group of cells are electrically connected together by a bit line, or data line. An electrical signal is used to program a cell or cells.

Computer, communication and industrial applications are driving the demand for memory devices in a variety of electronic systems. One important form of semiconductor memory device includes a non-volatile memory made up of floating-gate memory cells called flash memory. Computer applications use flash memory to store BIOS firmware. Peripheral devices such as printers store fonts and forms on flash memory. Digital cellular and wireless applications consume large quantities of flash memory. Portable applications such as digital cameras, audio recorders, personal digital assistants (PDAs) and test equipment also use flash memory as a medium to store data.

To achieve increasing performance requirements and to lower power demands, components of the memory device have been scaled down in terms of size and operating voltages. Unless the voltage supplied to the memory device is matched to the operating voltages of the components, care must be taken to avoid failures or errors within the device.

Sensing a data value of a memory cell in a flash memory device often includes a precharging operation where the bit line containing the target memory cell is precharged to some precharge potential. This precharge is often the supply potential. It is important that this precharge potential achieved on the bit line not be of a magnitude that will cause a read disturb, i.e., a partial programming, of the memory cells when its word line is driven. Even small accumulations of charge on the floating gate of the flash memory cell may be accumulated over several sensing operations such as to alter the data value stored in the cell. For reliability of the memory device, it is thus extremely important to mitigate such read disturb effects.

For the reasons stated above, and for other reasons stated below which will become apparent to those skilled in the art upon reading and understanding the present specification, there is a need in the art for alternative sensing devices for integrated-circuit memory devices, memory devices containing such sensing devices, and methods of their operation.

SUMMARY OF THE INVENTION

The above-mentioned problems with memory devices and other problems are addressed by the present invention and will be understood by reading and studying the following specification.

Single-ended sensing devices for sensing a programmed state of a floating-gate memory cell are described herein for use in high-voltage, low-power memory devices. Low-power memory devices rely on memory cells that operate at low voltages. However, some electronic systems may still provide higher supply potentials for operation of the memory device, e.g., 3V nominal. The drains of the memory cells must be protected from these higher supply potentials during sensing to avoid read disturb errors. One approach would be to provide a separate power supply, generated on-chip, to provide lower voltages during sensing. This approach, however, would result in a current draw from the external supply potential even during standby modes. The various embodiments of the invention provide protection of the memory cells from high external power supplies without the need to provide separate generation of lower potentials on-chip.

Sensing devices in accordance with the invention are adapted to accept supply potentials significantly higher than the maximum potential to be achieved on a bit line during a sensing operation. Sensing devices in accordance with the various embodiments include an input node selectively coupled to a floating-gate memory cell and an output node for providing an output signal indicative of the programmed state of the floating-gate memory cell. Such sensing devices further include a feedback loop coupled between a precharge path and the input node of the sensing device. The feedback loop limits the potential level achieved at the input node of the sensing device, thus limiting the potential level achieved by the bit lines during sensing.

The invention further provides memory devices and electronic systems making use of such sensing devices. The invention still further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The term substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a substrate in the following description, previous process steps may have been utilized to form regions/junctions in the base semiconductor structure, and the term substrate includes the underlying layers containing such regions/junctions. The following detailed description is, therefore, not to be taken in a limiting sense, and the scope of the present invention is defined only by the appended claims and equivalents thereof.

Figure 1A:
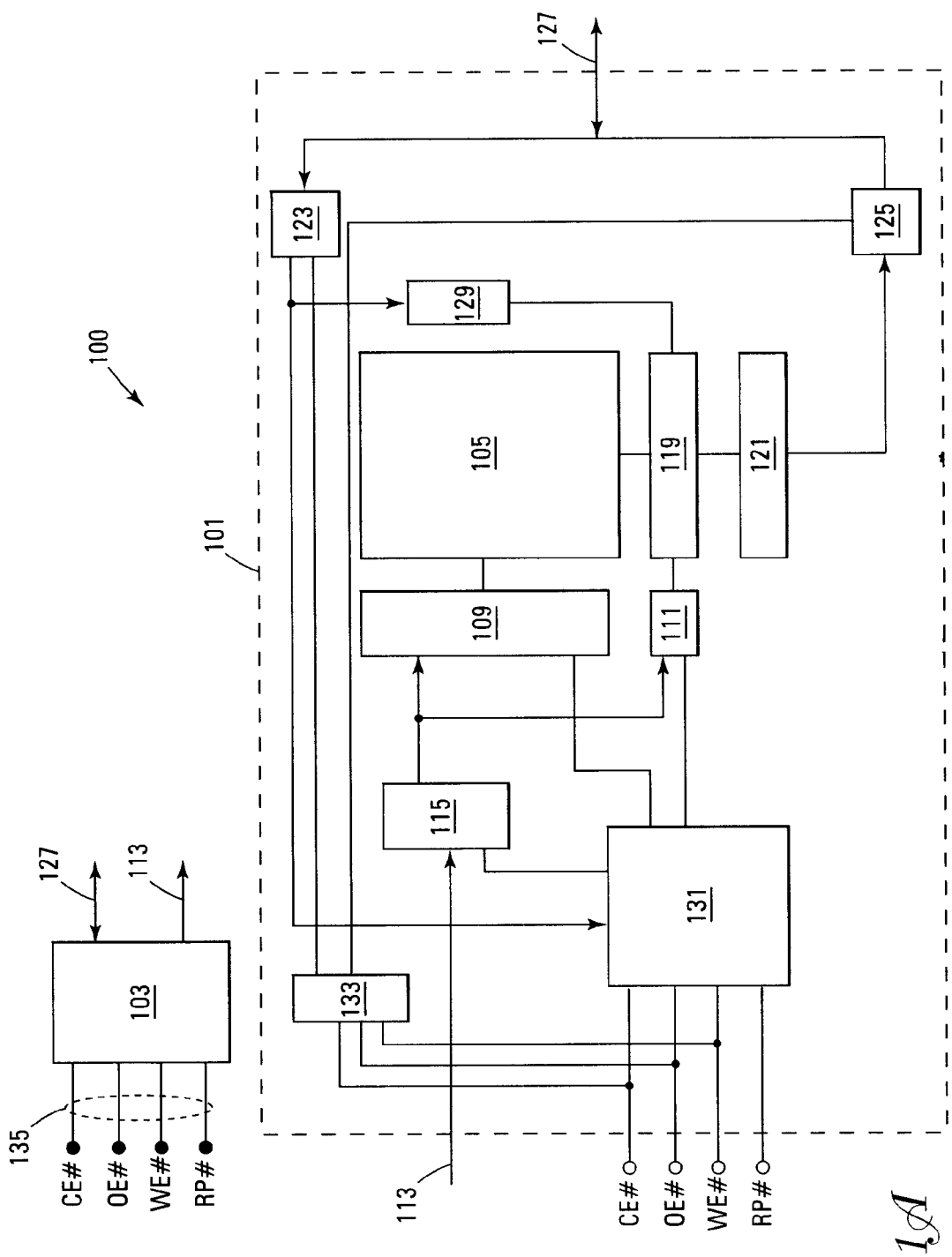
FIG. 1A is a block diagram of a basic flash memory device coupled to a processor as part of an electronic system.

Sensing devices in accordance with the various embodiments are adaptable for a variety of memory devices, including flash memory devices. FIG. 1A is a functional block diagram of a basic flash memory device 101 that is coupled to a processor 103. The memory device 101 and the processor 103 may form part of an electronic system 100. The memory device 101 has been simplified to focus on features of the memory that are helpful in understanding the present invention. The memory device 101 includes an array of memory cells 105. The memory cells are preferably non-volatile floating-gate memory cells and generally have their control gates coupled to word lines, drain regions coupled to local bit lines, and source regions commonly coupled to a ground potential. The memory array 105 is arranged in rows and columns, with the rows arranged in blocks. The memory cells generally can be erased in blocks. Data, however, may be stored in the memory array 105 separate from the block structure.

A row decoder 109 and a column decoder 111 are provided to decode address signals provided on address lines A0–Ax 113. An address buffer circuit 115 is provided to latch the address signals. Address signals are received and decoded to access the memory array 105. A column select circuit 119 is provided to select a column of the memory array 105 in response to control signals from the column decoder 111. Sensing circuitry 121 is used to sense and amplify data stored in the memory cells. Sensing circuitry 121 includes a sensing device in accordance with the various embodiments of the invention. Data input 123 and output 125 buffer circuits are included for bi-directional data communication over a plurality of data (DQ) lines 127 with the processor 103. A data latch 129 is typically provided between data input buffer circuit 123 and the DQ lines 127 for storing data values (to be written to a memory cell) received from the DQ lines 127. Data amplified by the sensing circuitry 121 is provided to the data output buffer circuit 125 for output on the DQ lines 127.

Command control circuit 131 decodes signals provided on control lines 135 from the processor 103. These signals are used to control the operations on the memory array 105, including data read, data write, and erase operations. Input/output control circuit 133 is used to control the data input buffer circuit 123 and the data output buffer circuit 125 in response to some of the control signals. As stated above, the flash memory device 101 has been simplified to facilitate a basic understanding of the features of the memory. A more detailed understanding of flash memories is known to those skilled in the art.

Figure 1B:
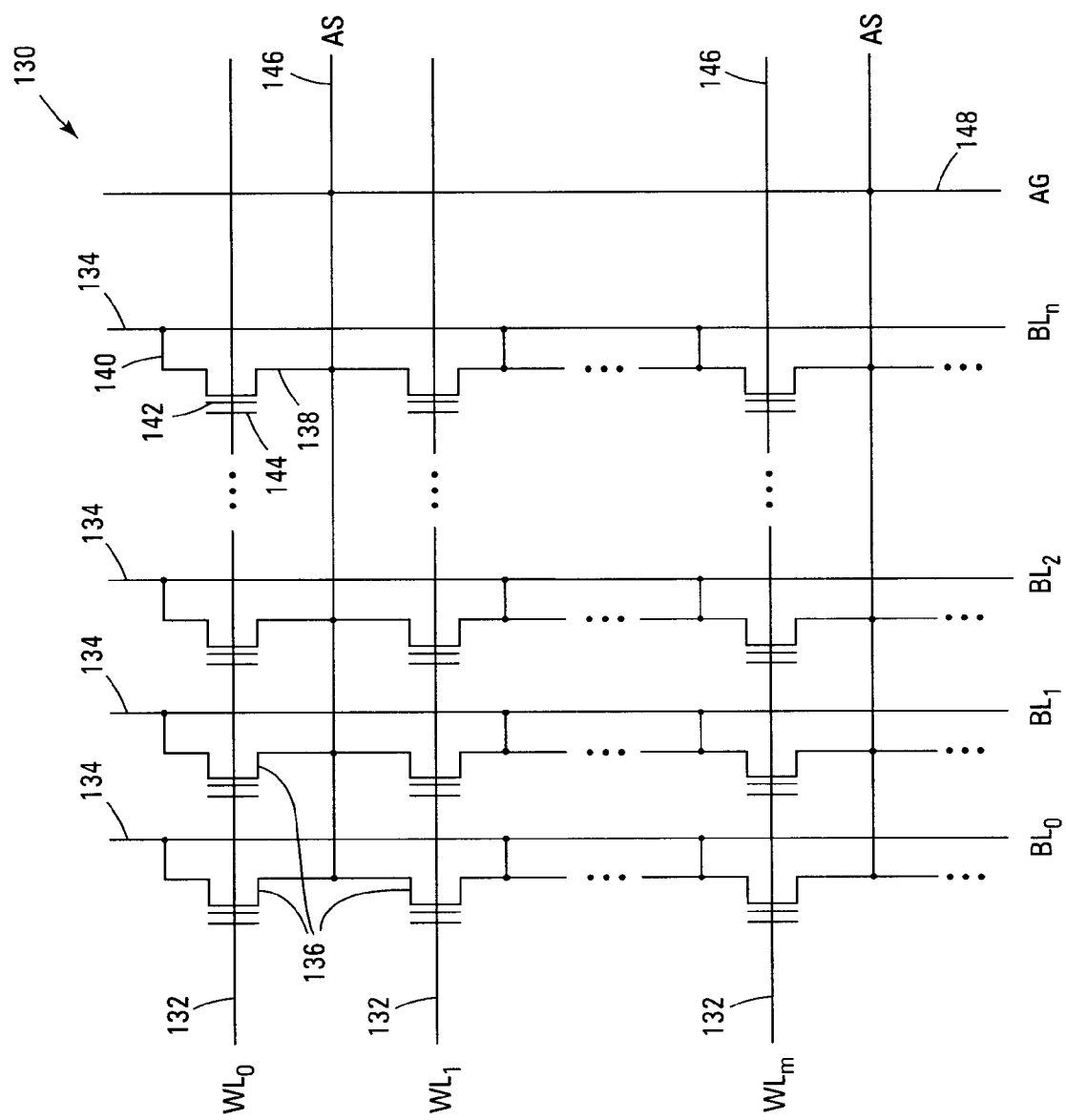
FIG. 1B is a schematic of a portion of a typical non-volatile memory main block as a portion of a memory array of a memory device of the type shown in FIG. 1A.

Arrays of flash memory cells are often configured as floating-gate transistors placed at the intersection of word lines and local bit lines. The word lines are coupled to the control gates of the floating-gate transistors. FIG. 1B is a schematic of a portion of a typical non-volatile memory main block 130 as a portion of the memory array 105.

The detail of main block 130 is provided to better understand the various embodiments of the invention. However, the invention is not limited to the specific floating-gate memory cell and layout described with reference to FIG. 1B.

As shown in FIG. 1B, the main block 130 includes word lines 132 and intersecting local bit lines 134. For ease of addressing in the digital environment, the number of word lines 132 and the number of local bit lines 134 are each some power of two, e.g., 256 word lines 132 by 4,096 local bit lines 134.

Floating-gate transistors 136 are located at each intersection of a word line 132 and a local bit line 134. The floating-gate transistors 136 represent the non-volatile memory cells for storage of data. Typical construction of such floating-gate transistors 136 include a source region 138 and a drain region 140 constructed from an $N^+$-type material of high impurity concentration formed in a P-type semiconductor substrate of low impurity concentration, a channel region formed between the source and drain, a floating gate 142, and a control gate 144. Floating gate 142 is isolated from the channel region by a tunneling dielectric and from the control gate 144 by an intergate dielectric. The materials of construction are not critical to the invention, but commonly include doped polysilicon for the gate materials, and silicon oxides, nitrides or oxynitrides for the dielectric materials. Floating-gate transistors 136 having their control gates 144 coupled to a word line 132 typically share a common source region 138 depicted as array source 146. To reduce resistance to each source region 138, each array source 146 is often coupled to a metal line to ground, such as array ground 148. As shown in FIG. 1B, floating-gate transistors 136 coupled to adjacent word lines 132 may share the same array source 146. Floating-gate transistors 136 have their drain regions 140 coupled to a local bit line 134. A column of the floating-gate transistors 136 are those transistors having their drain regions 140 commonly coupled to a given local bit line 134. A row of the floating-gate transistors 136 are those transistors having their control gates 144 commonly coupled to a given word line 132.

Figure 2:
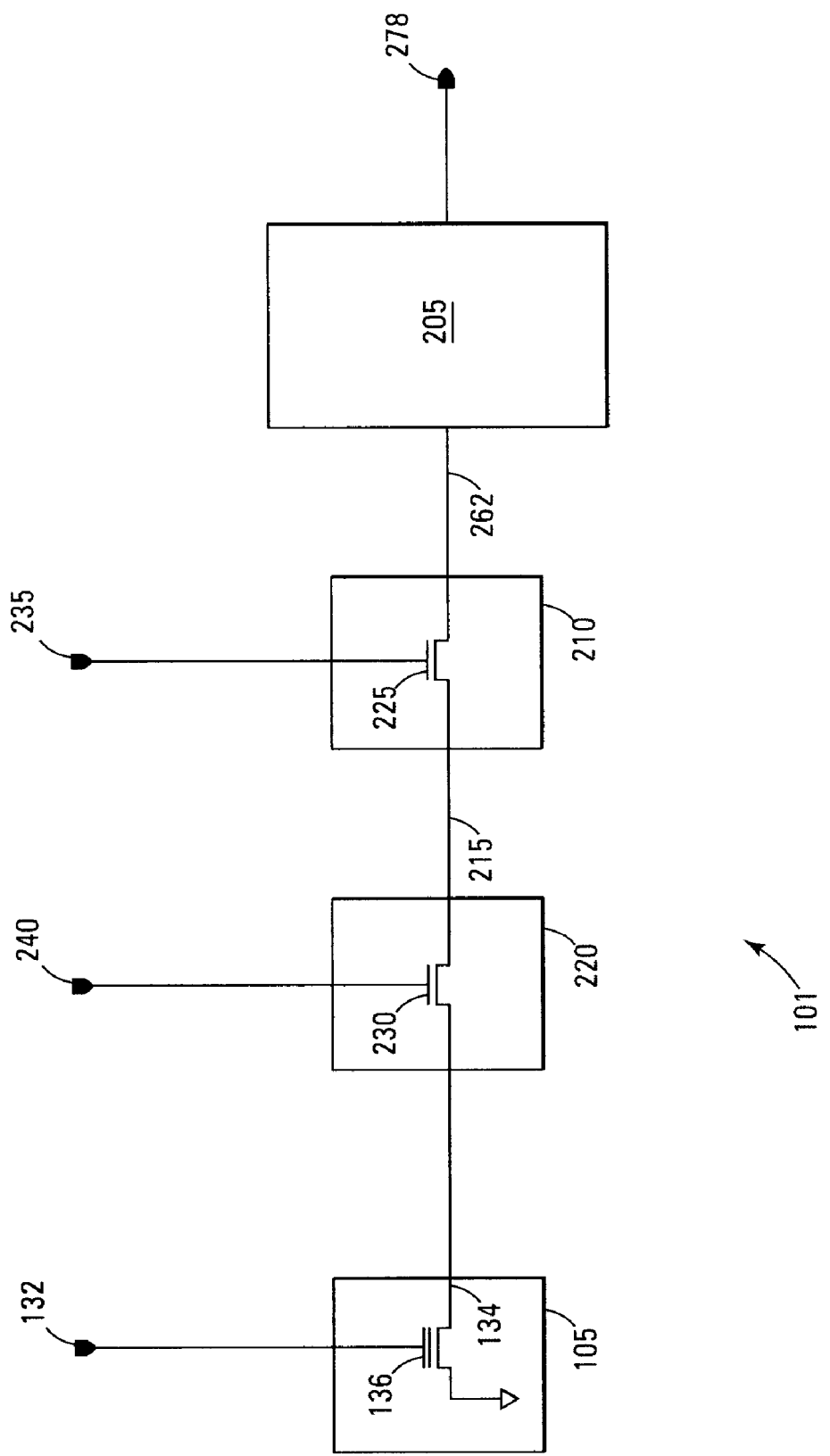
FIG. 2 is a schematic of a portion of a memory device having a single-ended sensing device.

FIG. 2 is a schematic of a portion of a memory device 101 having at least one sensing device 205 in accordance with the invention. As shown in FIG. 2, a target memory cell 136 is selectively coupled to a sensing device 205 through its associated local bit line 134 and global bit line 215. As noted previously, there are generally many local bit lines 134 associated with a single global bit line 215 and many global bit lines 215 associated with a single sensing device 205 in typical high-density memory devices. The sensing device 205 is generally one of many sensing devices 205 contained in the sensing circuitry 121 as depicted in FIG. 1A.

The global bit line 215 associated with the target memory cell 136 is coupled to an input node 262 of its associated sensing device 205 using pass circuit 210. Pass circuit 210 is depicted as containing a single selective coupling device or pass transistor 225 providing the selective coupling between the global bit line 215 and the sensing device 205.

The pass transistor 225 has a gate coupled to receive a control signal from node 235. Those skilled in the art of memory devices will recognize that pass circuit 210 would contain additional pass transistors associated with other global bit lines. Furthermore, additional pass transistors may be interposed between the global bit line 215 and the sensing device 205.

The local bit line 134 associated with the target memory cell 136 is coupled to its associated global bit line 215 using pass circuit 220. Pass circuit 220 is depicted as containing a single selective coupling device or pass transistor 230 providing the selective coupling between the local bit line 134 and the global bit line 215. The pass transistor 230 has a gate coupled to receive a control signal from node 240. Those skilled in the art of memory devices will recognize that pass circuit 220 would contain additional pass transistors associated with other local bit lines. Furthermore, additional pass transistors may be interposed between the local bit line 134 and the global bit line 215. Pass circuits 210 and 220 may represent a portion of the column select circuit 119 of FIG. 1A.

Figure 3:
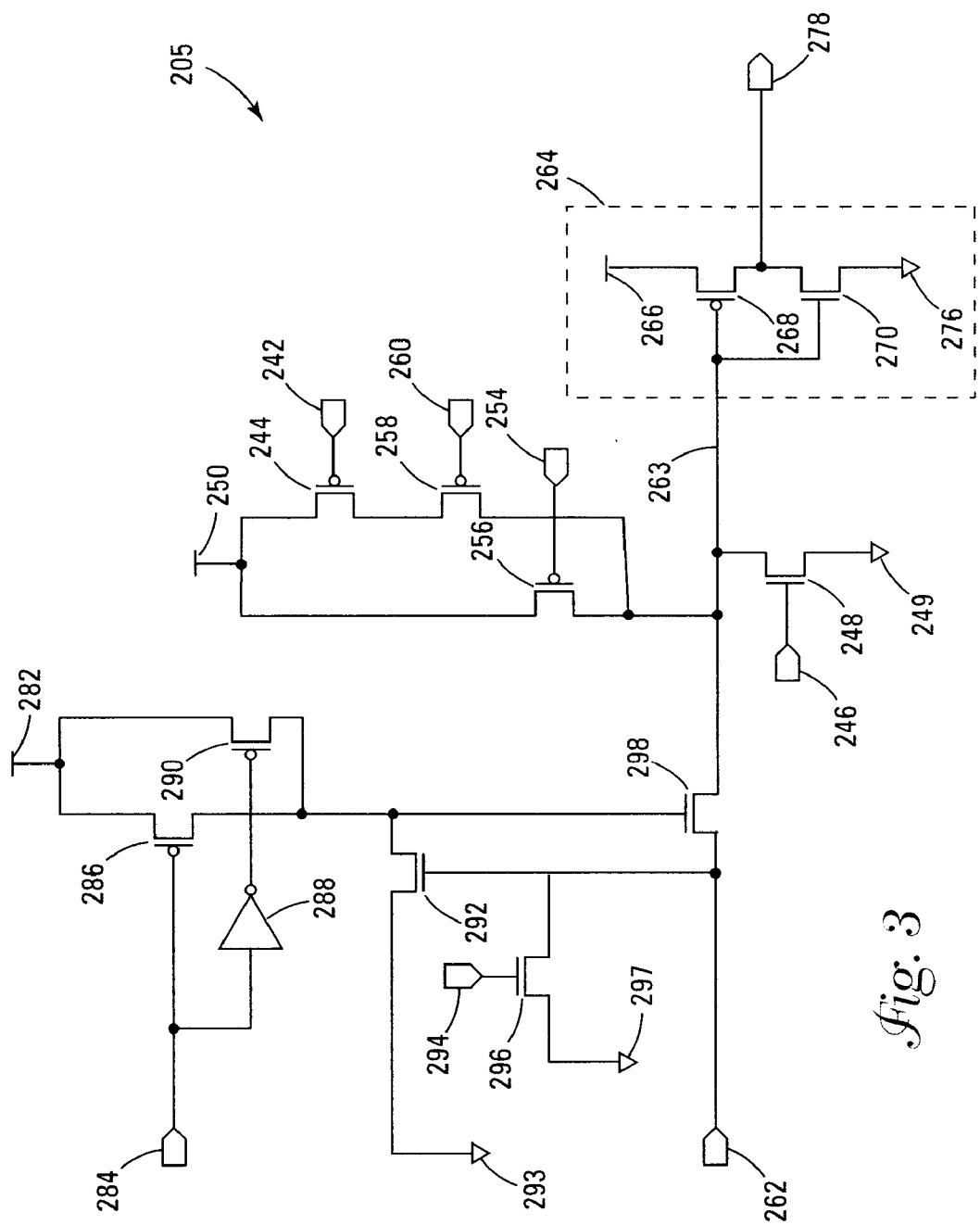
FIG. 3 is a schematic of a single-ended sensing device having a feedback loop.

FIG. 3 is a schematic of a sensing device 205 in accordance with an embodiment of the invention. The sensing device 205 includes a precharging path for selectively applying the precharge potential to charge the local bit line 134, the global bit line 215, and the input node 262. The precharging path is shown in FIG. 3 as the p-channel field-effect transistor (pFET) 256 coupled between a potential node 250 and a node 263, representative of the input of the sense inverter 264. The potential node 250 is coupled to receive the precharge potential. The precharge potential may be a supply potential, such as Vcc. The pFET 256 selectively couples the potential node 250 to the node 263 in response to a precharge control signal received at node 254.

The sensing device 205 further includes a reference current path for selectively applying a reference current to the node 263. Ideally, a target memory cell 136 and its path to the sensing device 205 would exhibit a zero current draw if the floating-gate transistor of the target memory cell 136 were programmed, i.e., in a first programmed state, such that the node 263 would remain at the precharge potential during sensing. However, some residual current may be expected, whether such residual current is due to leakage, depletion, or some other phenomena. This residual current could result in an erroneous indication that the target memory cell is erased, i.e., in a second programmed state. The reference current path provides a reference current to the node 263 to compensate for such residual currents and to avoid erroneous indications of the second programmed state.

The reference current path is shown in FIG. 3 as the pFET 258 coupled between the potential node 250 and the node 263. The reference current should be less than a current flow through the target memory cell 136 if the target memory cell 136 is erased or in the second programmed state, yet more than the expected residual current. For one embodiment, the reference current is controlled to be less than half of the expected current of an erased memory cell in the second programmed state. For a further embodiment, the reference current is controlled to be approximately one order of magnitude less than the expected current of an erased memory cell in the second programmed state. For one embodiment, the reference current is controlled through the application of a reference current control signal to the gate of the pFET 258 from node 260. Varying the potential level of the reference current control signal will vary the conductance of the pFET 258, resulting in control of the current flow through the reference current path. For one embodiment, the reference current path further includes pFET 244 responsive to an enable signal on node 242. The pFET 244 facilitates selectively enabling or disabling the reference current path aside from the action of the reference current control signal applied to node 260. Although the reference current path is shown to use the same potential node 250 as the precharging path, a separate potential node could also be used.

The sensing device 205 still further includes a sense inverter 264 having a threshold point. The sense inverter generates an output signal at output node 278 in response to a potential level at the node 263 relative to the threshold point. The logic level of the output signal is determined by whether the potential level at the node 263 is above or below the threshold point. The potential level of the node 263 during sensing is indicative of the state of the local bit line 134.

The sense inverter 264 includes a p-channel stage having a pFET 268 coupled between a potential node 266 and the output node 278. The potential node 266 is coupled to receive a supply potential, such as Vcc. The supply potential represents a first logic level, such as a logic high level. The sense inverter 264 further includes an nFET 270 coupled between the output node 278 and a potential node 276. The potential node 276 is coupled to receive a ground potential, such as Vss. The ground potential represents a second logic level, such as a logic low level. Other sense inverter configurations are understood in the art.

The sensing device 205 further includes a feedback loop to limit the potential level achieved at the input node 262, and thus to limit the potential level achieved by the bit lines, during sensing. The feedback loop permits current flow from the precharging path to the bit lines until the potential level on the bit lines reaches a predetermined maximum.

The feedback loop of FIG. 3 includes the nFET 298 coupled between the input node 262 and the node 263 and the nFET 292 having a drain coupled to the gate of the nFET 298, a source coupled to a ground potential node 293 and a gate coupled to the source of the nFET 298. The feedback loop is interposed between the precharging path and the bit lines. Although the embodiment of FIG. 3 includes the feedback loop interposed between the precharging path and the input node 262, such that one feedback loop is associated with each sensing device 205, a feedback loop could be associated with each global bit line or even each local bit line by interposing the feedback loop between the pass circuits 210 and 220 or between the pass circuit 220 and the memory cells 136, respectively. However, such an approach would greatly increase the amount of die area devoted to such feedback loops and would thus be generally less desirable.

A feedback loop of the type depicted in FIG. 3 needs to produce a control signal on the gate of the nFET 298 sufficient to activate it during the initial portion of the precharge phase and to deactivate it as the potential level on the bit lines reaches the predetermined maximum. One way to accomplish this goal is to apply a current signal to the gate of the nFET 298 that is sufficient to develop a $V_{GS}$ on the gate of the nFET 298 that exceeds its $V_T$ when the nFET 292 is deactivated, but insufficient to overcome the current sink created when the nFET 292 is activated. For the embodiment shown in FIG. 3, this current signal is generated at the drain of the pFET 286 coupled between a potential node 282 and the gate of the nFET 298. The potential node 282 is coupled to receive a supply potential, such as Vcc. The pFET 286 is preferably sized relative to the nFET 292 such that an inverter made of the pFET 286 as its p-channel stage and the nFET 292 as its n-channel stage would switch at an input voltage very close to the $V_T$ of the nFET 298. For one embodiment, the pFET 286 is a weak p-channel device, e.g., having a W/L ratio of approximately 3/10, and the nFET 292 is a relatively strong n-channel device, e.g., having a W/L ratio of approximately 10/1.

To quickly bring the nFET 298 to activation, the feedback loop may further include a pull-up transistor, such as the pFET 290 coupled between the potential node 282 and the gate of the nFET 298. For the embodiment of FIG. 3, the gate of the pFET 286 is coupled to receive an enable signal on node 284 while the gate of the pFET 290 is coupled to receive the enable signal through an inverter 288. In this manner, when the pFET 286 is activated, such as during a sensing operation, the pFET 290 is deactivated. While the use of the pFET 290 improves the speed of the sensing device, the use of the pFET 286 alone would eventually bring the nFET 298 to activation. Although not shown in FIG. 3, a filter capacitor to ground may be coupled to the gate of the nFET 298 to protect it from noise effects. During sensing, excessive noise disturbance on the gate of the nFET 298 could lead to an erroneous reading of the data value stored in the target memory cell. As will be apparent later, activation of the nFET 298 during the brief period of active sensing, e.g., a few nanoseconds, could transfer charge from the input of the sense inverter 264 causing it to switch logic levels.

For ease of resetting the sensing device 205, the embodiment of FIG. 3 includes the nFET 248 and nFET 296 to selectively ground the node 263 and the input node 262, respectively. The nFET 248 is coupled between the node 263 and a ground potential node 249 and is responsive to the enable signal received on node 246. The nFET 296 is coupled between the gate of the nFET 292 and a ground potential node 297 and is responsive to the enable signal received on node 294.

During sensing, if the target memory cell is in the second programmed state, the bit lines will be expected to drop to a potential below their precharge potential. The expected bit line potential is approximately their precharge potential minus the threshold voltage of the transistors minus some delta for ohmic drop across the bit lines. The threshold point of the sense inverter 264 must be some potential level higher than this expected bit line potential in order to reliably detect and amplify the data value of the target memory cell.

Operation of the memory device 101 proceeds generally as follows. The bit lines 134 and 215 are decoded and coupled to the input node 262 of a sensing device 205. The decoded bit lines may be thought of as a single bit line coupled to the target memory cell. The enable signal has a first logic level, such as Vcc, adapted to activate the nFETs 248 and 296 and the pFET 290, and to deactivate the pFETs 244 and 286. In conjunction, the precharge control signal has a first logic level, such as Vcc, adapted to deactivate the pFET 256. As such, the bit line, input node 262 and the node 263 are brought to a ground potential. The enable signal is then transitioned to a second logic level, such as Vss, adapted to deactivate the nFETs 248 and 296 and the pFET 290, and to activate the pFETs 244 and 286. In conjunction, the precharge control signal is brought to a second logic level, such as Vss, adapted to activate the pFET 256. Given the relatively low capacitance of the node 263, it is quickly pulled up to the supply potential of potential node 250 at this point. As the nFET 298 was activated prior to transitioning the enable signal to its second logic level, it begins the precharging phase in an activated state. This will begin charging the bit line and the input node 262.

As the potential level rises on the input node 262, the gate bias applied to the nFET 292 will rise and begin to activate the nFET 292. This will begin to sink current from the gate of the nFET 298. As the current sink through the nFET 292 begins to equilibrate with the current signal through the pFET 286, the nFET 298 will begin to deactivate such that it becomes increasingly resistive and begins to restrict charge transfer between the node 263 and the input node 262. The result is to limit the potential level achieved on the input node 262, and thus the bit line, to the gate bias on the nFET 292 that produces a current sink of nFET 292 equal to the current signal of the pFET 286. The pFET 286 is preferably sized relative to the nFET 292 such that when the predetermined maximum potential for the bit line is applied to the gate of the nFET 292, the potential level developed at the gate of the nFET 298 is limited to approximately the threshold voltage, $V_T$, of the nFET 298 plus the predetermined maximum potential.

As an example, assume the predetermined maximum potential is equal to approximately the $V_T$ of the nFETs 292 and 298. Further assume the gate of the pFET 286 receives the ground potential Vss and the source of the pFET 286 receives the supply potential Vcc. The pFET 286 should be sized relative to the nFET 292 such that a steady-state potential level of $2*V_T$ is achieved at the drain of the pFET 286 when $V_T$ is applied to the gate of the nFET 292.

During the precharging phase, the word line 132 of the target memory cell 136 is driven. In addition, a reference current is applied to the input node 262 of the sensing device 205 through the reference current path. The bit line is then isolated from the precharge potential while maintaining application of the reference current. The programmed state of the target memory cell 136 is sensed and amplified by the sensing device 205. The data value at the output node 278 is latched and the memory device is returned to a low power mode.

Figure 4A:
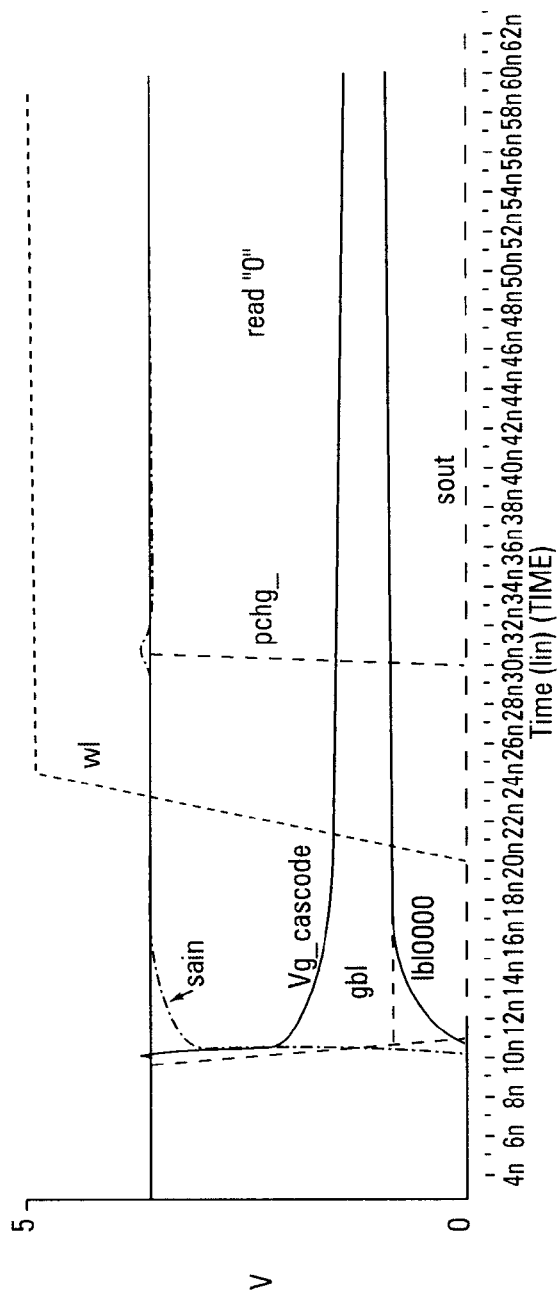
FIGS. 4A and 4B are signal traces showing various signals of the memory device during a sensing operation of a target memory cell in either a first or second programmed state.
Figure 4B:
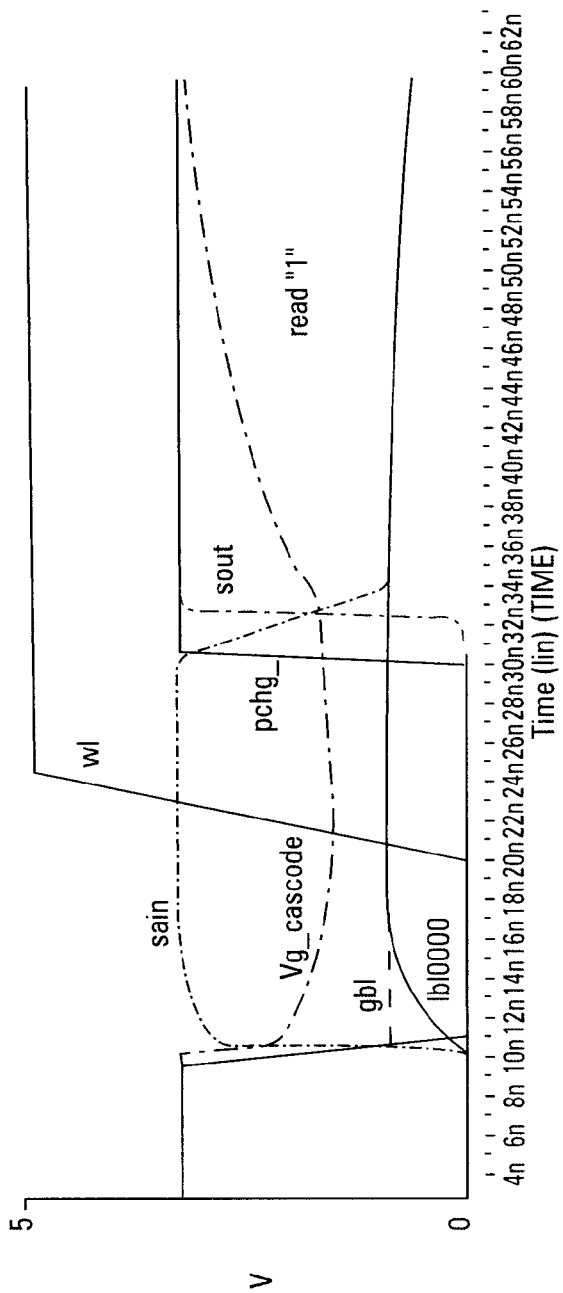

FIG. 4A is a signal trace showing various signals of the memory device during a sensing operation of a target memory cell in a first programmed state in accordance with an embodiment of the invention. FIG. 4B is a signal trace showing various signals of the memory device during a sensing operation of a target memory cell in a second programmed state in accordance with an embodiment of the invention. In FIGS. 4A and 4B, the precharge control signal, pchg__, is brought low to begin the precharging phase. The input to the sense inverter 264 at the node 263, sain, is quickly charged to Vcc. Likewise, the potential level on the global bit line, gbl, is quickly brought up to the $V_T$ of the nFETs such that the gate bias applied to the nFET 298, vg__cascode, begins to drop to a steady-state value in response to the current sink created by the nFET 292. This results in deactivation of the nFET 298 to limit any further charging of the local bit line, lbl0000. The word line is driven, wl, to the read potential and the precharge control signal, pchg__, is brought back to high to isolate the bit lines from the precharge potential.

If the target memory cell is in the first programmed state, as shown in FIG. 4A, the target memory cell will not sink a current from the local bit line and the output of the sensing device, sout, will remain at a logic low level. This logic low level is then latched for access by an external device.

If the target memory cell is in the second programmed state, as shown in FIG. 4B, the target memory cell will sink a current from the local bit line. As current is drawn from the local bit line, the potential levels on the local bit line and the global bit line, i.e., lbl0000 and gbl, respectively, will begin to drop. In turn, the nFET 292 will begin to deactivate, resulting in an increasing gate bias, vg_cascode, on the nFET 298. As the gate bias is increased on the nFET 298, the target memory cell will begin to sink current from the input of the sense inverter such that its potential level, sain, will begin to drop. As the potential level sain drops below the threshold point of the sense inverter, the sense inverter will switch such that its output, sout, goes logic high. This logic high level is then latched for access by an external device. Note that as the nFET 292 begins deactivation, the current sink from the gate of the nFET 298 will reduce, resulting in an increasing potential level achieved on the gate of the nFET 298.

Figure 5A:
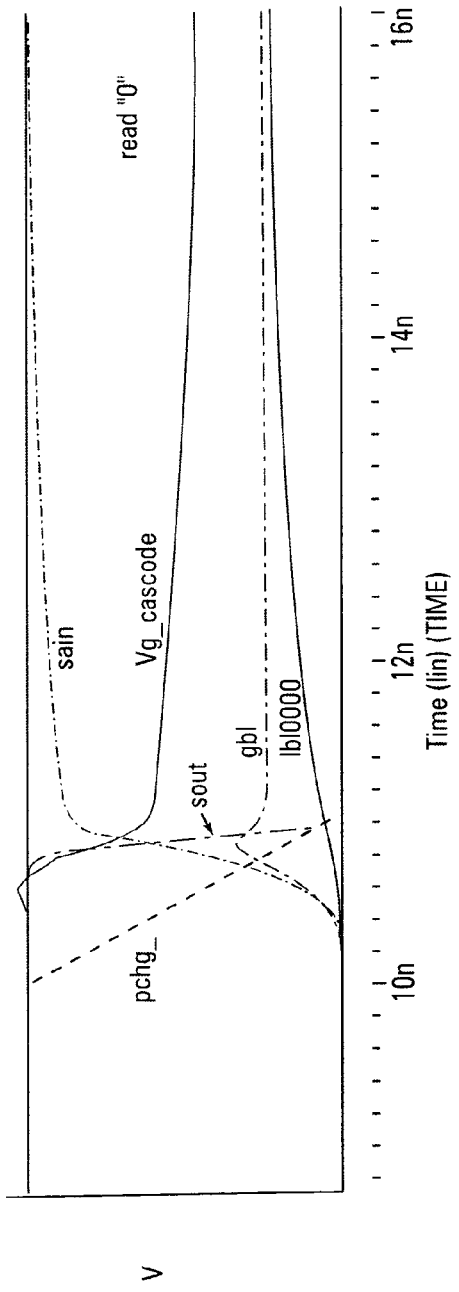
FIGS. 5A and 5B are signal traces showing additional detail corresponding to FIGS. 4A and 4B, respectively.
Figure 5B:
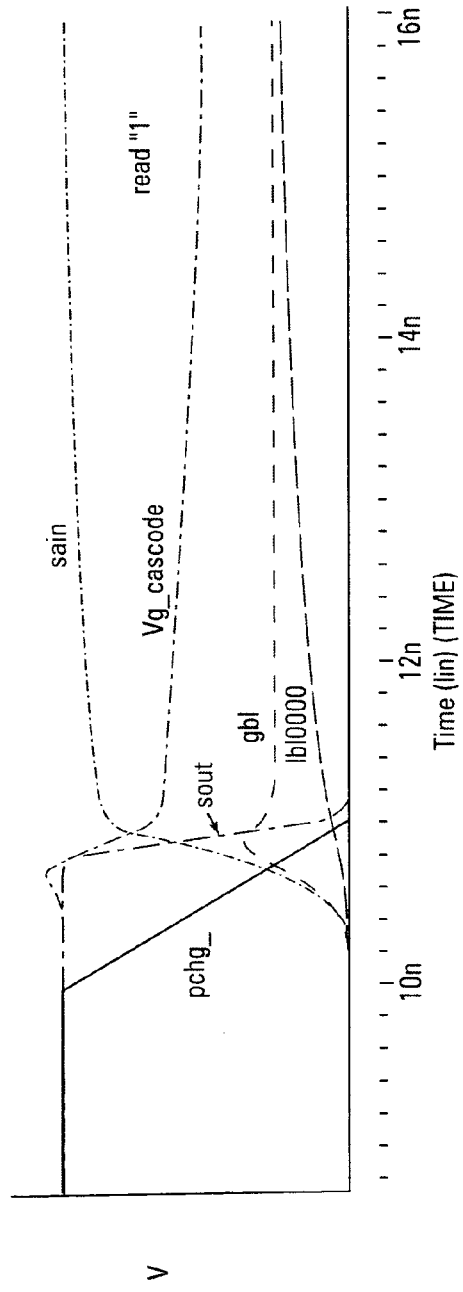

FIGS. 5A and 5B are signal traces showing additional detail corresponding to FIGS. 4A and 4B, respectively. In particular, these traces show that the feedback loop provides good control over the maximum potential level developed on the global bit line as the overshoot of gbl is relatively small. It is generally considered desirable to limit the potential level of the local bit line to less than approximately 1V to avoid read disturb errors. The various embodiments are capable of using supply potentials of greater than approximately 1.8V, and particularly in a typical range of approximately 2.7–3.6V, while limiting the potential level on the local bit lines to approximately the level of $V_T$, e.g., approximately 0.8V under standard technology.

The access time in a flash memory device is generally determined by the time needed to raise the word line to the desired read potential, wl, and by the time required to precharge the bit lines, which occur concurrently. The speed of the memory device is limited by whichever event is slower. Using an embodiment of the invention facilitates a reduction in the precharge time to the point where the rise time on the word line becomes the limiting factor. The access time of the memory device can thus be further improved by such routine changes as reducing the resistance of the word lines, e.g., using lower-resistance materials for the word lines or increasing the level of metal content of the word lines.

The examples of FIGS. 4A and 4B use a precharge time of approximately 20ns. This is significantly shorter than a typical 30–40ns precharge time. The precharge time can be reduced to approximately 15ns over a Vcc range of approximately 2.5V to approximately 3.7V. Higher values of Vcc generally facilitate shorter precharge times. For example, a precharge time of approximately 10ns is acceptable for values of Vcc of approximately 2.9V or higher. The maximum value of Vcc should be less than a breakdown voltage of at least the nFET 298. While the sensing devices of the various embodiments are especially adapted for Vcc values higher than approximately 1.8V, they will continue to operate at lower values of Vcc. The difference at lower values of Vcc is that the maximum potential level developed on the bit line will be insufficient to activate the nFET 292 such that the nFET 298 remains activated during the entire sensing operation.

CONCLUSION

Single-ended sensing devices for sensing a programmed state of a floating-gate memory cell have been described for use in low-power memory devices. Sensing devices in accordance with the invention are adapted to accept supply potentials significantly higher than the maximum potential to be achieved on a bit line during a sensing operation. Sensing devices in accordance with the various embodiments include an input node selectively coupled to a floating-gate memory cell and an output node for providing an output signal indicative of the programmed state of the floating-gate memory cell. Such sensing devices further include a feedback loop coupled between a precharge path and the input node of the sensing device. The feedback loop limits the potential level achieved at the input node of the sensing device, thus limiting the potential level achieved by the bit lines during sensing.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, while the floating-gate memory cells described herein determine a data value by an amount of charge stored on the floating gate, other floating-gate memory cells can determine their data values by approaches other than a stored charge. One example includes a ferroelectric floating-gate memory cell where the data value of the memory cell is determined by the degree of polarization of a ferroelectric material making up the floating gate. In both cases, however, the data value may be sensed using current sensing techniques of the type described herein. Accordingly, this application is intended to cover any adaptations or variations of the invention. It is manifestly intended that this invention be limited only by the following claims and equivalents thereof.

What is claimed is:

1. A sensing device for sensing a programmed state of a floating-gate memory cell, wherein the sensing device has an input node selectively coupled to the floating-gate memory cell, the sensing device comprising:
    a sense inverter having an input and an output for providing an output signal indicative of a potential level of the input of the sense inverter relative to a threshold point;
    a precharge path coupled to the input of the sense inverter for providing a precharge potential to the input of the sense inverter; and
    a feedback loop interposed between the precharge path and the input node of the sensing device, wherein the feedback loop limits a potential level on the input node of the sensing device to a predetermined maximum potential level.

2. The sensing device of claim 1, wherein the predetermined maximum potential level is less than about 1V.

3. The sensing device of claim 2, wherein the precharge potential is approximately 3V.

4. The sensing device of claim 1, wherein the precharge potential is greater than approximately 2.5V and less than approximately 3.7V.

5. The sensing device of claim 1, further comprising:
    a reference current path coupled to the input of the sense inverter for providing a reference current to the input of the sense inverter.

6. A sensing device for sensing a programmed state of a floating-gate memory cell, wherein the sensing device has an input node selectively coupled to the floating-gate memory cell, the sensing device comprising:
    a sense inverter having an input and an output for providing an output signal indicative of a potential level of the input of the sense inverter relative to a threshold point;
    a precharge path coupled to the input of the sense inverter for providing a precharge potential to the input of the sense inverter; and a feedback loop interposed between the precharge path and the input node of the sensing device, wherein the feedback loop presents an increasing level of resistance as a potential level on the input node of the sensing device approaches a predetermined maximum level.

7. The sensing device of claim 6, wherein the feedback loop presents sufficient resistance to substantially stop charge transfer between the input of the sense inverter and the input node of the sensing device when the potential level of the input node of the sensing device is at the predetermined maximum level and the input of the sense inverter is at the precharge potential.

8. The sensing device of claim 6, wherein the predetermined maximum level of the potential level on the input node of the sensing device is less than about 1V.

9. The sensing device of claim 8, wherein the precharge potential is greater than approximately 2.5V and less than approximately 3.7V.

10. The sensing device of claim 6, wherein the precharge potential is approximately 3V.

11. A sensing device for sensing a programmed state of a floating-gate memory cell, wherein the sensing device has an input node selectively coupled to the floating-gate memory cell, the sensing device comprising:
    a sense inverter having an input and an output for providing an output signal indicative of a potential level of the input of the sense inverter relative to a threshold point;
    a precharge path coupled to the input of the sense inverter for providing a precharge potential to the input of the sense inverter; and
    a feedback loop comprising a first n-channel field-effect transistor coupled between the precharge path and the input node of the sensing device and a second n-channel field-effect transistor having a gate coupled to the input node of the sensing device, a drain coupled to the gate of the first n-channel field-effect transistor and a source coupled to a ground potential node, wherein the gate of the first n-channel field-effect transistor is further coupled to receive a current signal.

12. The sensing device of claim 11, wherein a current sink developed through the second n-channel field-effect transistor equals the current signal when a predetermined potential is applied to the input node of the sensing device.

13. The sensing device of claim 11, wherein the current signal is provided through a p-channel field-effect transistor that is sized relative to the second n-channel transistor such that an inverter made up of the p-channel field-effect transistor and the second n-channel field-effect transistor would switch at approximately the threshold voltage of the second n-channel field-effect transistor.

14. A sensing device, comprising:
    a sense inverter;
    a first p-channel field-effect transistor coupled between a first potential node and an input of the sense inverter;
    a second p-channel field-effect transistor coupled between the first potential node and the input of the sense inverter;
    a first n-channel field-effect transistor coupled between the input of the sense inverter and an input node of the sensing device;
    a second n-channel field-effect transistor having a gate coupled to the input node of the sensing device, a drain coupled to a gate of the first n-channel field-effect transistor and a source coupled to a second potential node;
    a third p-channel field-effect transistor coupled between a third potential node and the gate of the first n-channel field-effect transistor, wherein the third p-channel field-effect transistor has a gate coupled to receive an enable signal; and
    a fourth p-channel field-effect transistor coupled between the third potential node and the gate of the first n-channel field-effect transistor, wherein the fourth p-channel field-effect transistor has a gate coupled to receive the enable signal through an inverter.

15. The sensing device of claim 14, wherein the first potential node and the third potential node are each coupled to receive a supply potential and the second potential node is coupled to receive a ground potential.

16. The sensing device of claim 15, wherein the supply potential is approximately 3V.

17. The sensing device of claim 15, wherein the supply potential is greater than approximately 2.5V and less than approximately 3.7V.

18. The sensing device of claim 15, wherein the supply potential is greater than approximately 3.7V and less than a breakdown voltage of the first n-channel field-effect transistor.

19. The sensing device of claim 14, further comprising:
    a fifth p-channel field-effect transistor coupled between the first potential node and the second p-channel field-effect transistor and having a gate coupled to receive the enable signal;
    a third n-channel field-effect transistor coupled between the input of the sense inverter and a fourth potential node and having a gate coupled to receive the enable signal; and
    a fourth n-channel field-effect transistor coupled between the input node of the sensing device and a fifth potential node and having a gate coupled to receive the enable signal.

20. The sensing device of claim 19, wherein the fourth potential node and the fifth potential node are each coupled to receive a ground potential.

21. The sensing device of claim 14, wherein the sense inverter further comprises:
    a p-channel stage having a source coupled to a sixth potential node, a drain coupled to an output node of the sensing device and a gate coupled to the input of the sense inverter; and
    an n-channel stage having a source coupled to a seventh potential node, a drain coupled to the output node and a gate coupled to the input of the sense inverter.

22. The sensing device of claim 21, wherein the sixth potential node is coupled to receive a supply potential and the seventh potential node is coupled to receive a ground potential.

23. A method of sensing a programmed state of a floating-gate memory cell, the method comprising:
    coupling a bit line to an input node of a sensing device, wherein the bit line is coupled to a source/drain region of the floating-gate memory cell;
    applying a precharge potential to the input node through a feedback loop;
    increasing a resistance of the feedback loop in response to an increasing potential level of the input node, thereby limiting the potential level developed on the input node to a predetermined maximum;
    driving a word line coupled to a control gate of the floating-gate memory cell;

isolating the input node from the precharge potential; and sensing the potential level at the input node, wherein the potential level at the input node is indicative of the programmed state of the floating-gate memory cell.

24. The method of claim 23, wherein the precharge potential is approximately 3V.

25. The method of claim 24, wherein the predetermined maximum of the potential level developed on the input node is less than about 1V.

26. The method of claim 23, wherein the precharge potential is greater than approximately 2.2V.

27. The method of claim 23, wherein the precharge potential is greater than approximately 2.5V and less than approximately 3.7V.

28. A method of sensing a programmed state of a floating-gate memory cell, the method comprising:

coupling a bit line to an input node of a sensing device, wherein the bit line is coupled to a source/drain region of the floating-gate memory cell;

applying a precharge potential to an input of a sense inverter of the sensing device;

coupling the input node of the sensing device to the input of the sense inverter through an n-channel field-effect transistor having a gate coupled to receive a current signal;

sinking current from the gate of the n-channel field-effect transistor in response to an increasing potential level of the input node of the sensing device, thereby beginning to deactivate the n-channel field-effect transistor;

increasing a resistance of a feedback loop in response to the increasing potential level of the input node, thereby limiting the potential level developed on the input node to a predetermined maximum;

driving a word line coupled to a control gate of the floating-gate memory cell;

isolating the input of the sense inverter from the precharge potential; and sensing a potential level at the input of the sense inverter, wherein the potential level at the input of the sense inverter is indicative of the programmed state of the floating-gate memory cell.

29. The method of claim 28, wherein the precharge potential is approximately 3V.

30. The method of claim 28, wherein the predetermined maximum of the potential level developed on the input node is approximately equal to a threshold voltage of the n-channel field-effect transistor.

31. The method of claim 28, wherein the precharge potential is greater than approximately 2.5V and less than approximately 3.7V.

32. The method of claim 31, wherein the predetermined maximum of the potential level developed on the input node is less than approximately 1V.

33. The method of claim 28, wherein the precharge potential is greater than approximately 3.7V and less than a breakdown voltage of the n-channel field-effect transistor.

34. The method of claim 28, wherein the potential level at the input of the sense inverter remains at the precharge potential when the floating-gate memory cell is in a first programmed state and wherein the potential level at the input of the sense inverter falls from the precharge potential when the floating-gate memory cell is in a second programmed state.

35. The method of claim 28, wherein the potential level at the input of the sense inverter remains at the precharge potential when the potential level at the input node of the sensing device remains at the predetermined maximum and wherein the potential level at the input of the sense inverter falls from the precharge potential when the potential level at the input node of the sensing device falls below the predetermined maximum.

36. A method of sensing a programmed state of a floating-gate memory cell, the method comprising:

coupling a bit line to an input node of a sensing device, wherein the bit line is coupled to a source/drain region of the floating-gate memory cell;

applying a precharge potential to an input of a sense inverter of the sensing device;

coupling the input node of the sensing device to the input of the sense inverter through an n-channel field-effect transistor having a gate coupled to receive a current signal;

generating the current signal through a p-channel field-effect transistor having a source coupled to receive a supply potential and a drain coupled to the gate of the n-channel field-effect transistor;

sinking current from the gate of the n-channel field-effect transistor in response to an increasing potential level of the input node of the sensing device, wherein the current sink from the gate of the n-channel field-effect transistor would equal the current signal through the p-channel field-effect transistor when the potential level of the input node of the sensing device is approximately equal to a threshold voltage of the n-channel field-effect transistor;

driving a word line coupled to a control gate of the floating-gate memory cell;

isolating the input of the sense inverter from the precharge potential; and sensing a potential level at the input of the sense inverter, wherein the potential level at the input of the sense inverter is indicative of the programmed state of the floating-gate memory cell.

37. The method of claim 36, wherein the precharge potential is greater than approximately 2.2V and a predetermined maximum of the potential level developed on the input node is less than approximately 1V.

38. The method of claim 36, wherein the precharge potential is greater than approximately two times the threshold voltage of the n-channel field-effect transistor and a predetermined maximum of the potential level developed on the input node is less than approximately one times the threshold voltage of the n-channel field-effect transistor.

39. The method of claim 36, wherein the potential level at the input of the sense inverter remains at the precharge potential when the floating-gate memory cell is in a first programmed state and wherein the potential level at the input of the sense inverter falls from the precharge potential when the floating-gate memory cell is in a second programmed state.

40. The method of claim 36, wherein the potential level at the input of the sense inverter remains at the precharge potential when the potential level at the input node of the sensing device remains at a predetermined maximum and wherein the potential level at the input of the sense inverter falls from the precharge potential when the potential level at the input node of the sensing device falls below the predetermined maximum.

41. A flash memory device having an array of floating-gate memory cells, wherein the flash memory device comprises:

a single-ended sensing device for sensing a programmed state of a floating-gate memory cell, wherein the sensing device has an input node selectively coupled to the floating-gate memory cell, the sensing device further comprising:
- a sense inverter having an input and an output for providing an output signal indicative of a potential level of the input of the sense inverter relative to a threshold point;
- a precharge path coupled to the input of the sense inverter for providing a precharge potential to the input of the sense inverter; and
- a feedback loop interposed between the precharge path and the input node of the sensing device, wherein the feedback loop limits a potential level on the input node of the sensing device to a predetermined maximum potential level.

42. A flash memory device having an array of floating-gate memory cells, wherein the flash memory device comprises:
- a single-ended sensing device for sensing a programmed state of a floating-gate memory cell, wherein the sensing device has an input node selectively coupled to the floating-gate memory cell, the sensing device further comprising:
  - a sense inverter having an input and an output for providing an output signal indicative of a potential level of the input of the sense inverter relative to a threshold point;
  - a precharge path coupled to the input of the sense inverter for providing a precharge potential to the input of the sense inverter; and
  - a feedback loop interposed between the precharge path and the input node of the sensing device, wherein the feedback loop presents an increasing level of resistance as a potential level on the input node of the sensing device approaches a predetermined maximum level.

43. A flash memory device having an array of floating-gate memory cells, wherein the flash memory device comprises:
- a single-ended sensing device for sensing a programmed state of a floating-gate memory cell, wherein the sensing device has an input node selectively coupled to the floating-gate memory cell, the sensing device further comprising:
  - a sense inverter having an input and an output for providing an output signal indicative of a potential level of the input of the sense inverter relative to a threshold point;
  - a precharge path coupled to the input of the sense inverter for providing a precharge potential to the input of the sense inverter; and
  - a feedback loop comprising a first n-channel field-effect transistor coupled between the precharge path and the input node of the sensing device and a second n-channel field-effect transistor having a gate coupled to the input node of the sensing device, a drain coupled to the gate of the first n-channel field-effect transistor and a source coupled to a ground potential node, wherein the gate of the first n-channel field-effect transistor is further coupled to receive a current signal.

44. An electronic system, comprising:
- a processor; and
- a memory device coupled to the processor, the memory device having an array of floating-gate memory cells, wherein the memory device further comprises:
  - a single-ended sensing device for sensing a programmed state of a floating-gate memory cell, wherein the sensing device has an input node selectively coupled to the floating-gate memory cell, the sensing device further comprising:
    - a sense inverter having an input and an output for providing an output signal indicative of a potential level of the input of the sense inverter relative to a threshold point;
    - a precharge path coupled to the input of the sense inverter for providing a precharge potential to the input of the sense inverter; and
    - a feedback loop interposed between the precharge path and the input node of the sensing device, wherein the feedback loop limits a potential level on the input node of the sensing device to a predetermined maximum potential level.

45. An electronic system, comprising:
- a processor; and
- a memory device coupled to the processor, the memory device having an array of floating-gate memory cells, wherein the memory device further comprises:
  - a single-ended sensing device for sensing a programmed state of a floating-gate memory cell, wherein the sensing device has an input node selectively coupled to the floating-gate memory cell, the sensing device further comprising:
    - a sense inverter having an input and an output for providing an output signal indicative of a potential level of the input of the sense inverter relative to a threshold point;
    - a precharge path coupled to the input of the sense inverter for providing a precharge potential to the input of the sense inverter; and
    - a feedback loop interposed between the precharge path and the input node of the sensing device, wherein the feedback loop presents an increasing level of resistance as a potential level on the input node of the sensing device approaches a predetermined maximum level.

46. An electronic system, comprising:
- a processor; and
- a memory device coupled to the processor, the memory device having an array of floating-gate memory cells, wherein the memory device further comprises:
  - a single-ended sensing device for sensing a programmed state of a floating-gate memory cell, wherein the sensing device has an input node selectively coupled to the floating-gate memory cell, the sensing device further comprising:
    - a sense inverter having an input and an output for providing an output signal indicative of a potential level of the input of the sense inverter relative to a threshold point;
    - a precharge path coupled to the input of the sense inverter for providing a precharge potential to the input of the sense inverter; and
    - a feedback loop comprising a first n-channel field-effect transistor coupled between the precharge path and the input node of the sensing device and a second n-channel field-effect transistor having a gate coupled to the input node of the sensing device, a drain coupled to the gate of the first n-channel field-effect transistor and a source coupled to a ground potential node, wherein the gate of the first n-channel field-effect transistor is further coupled to receive a current signal.

* * * * *

UNITED STATES PATENT AND TRADEMARK OFFICE
CERTIFICATE OF CORRECTION

PATENT NO.    : 6,671,206 B2
DATED         : December 30, 2003
INVENTOR(S)   : Vali et al.

It is certified that error appears in the above-identified patent and that said Letters Patent is hereby corrected as shown below:

Title page,
Add Item:
-- [30]  Foreign Application Priority Data
August 31, 2001  (IT) …………….. RM2001A000531 --

Column 1,
Line 2, replace "filed Aug. 29, 2001" with -- filed Aug. 31, 2001 --

Signed and Sealed this

Sixteenth Day of March, 2004

JON W. DUDAS
*Acting Director of the United States Patent and Trademark Office*